United States Patent
Kim et al.

(10) Patent No.: US 9,799,541 B1
(45) Date of Patent: Oct. 24, 2017

(54) MULTIPLE WAFER SINGLE BATH ETCHER

(71) Applicant: TruTag Technologies, Inc., Kapolei, HI (US)

(72) Inventors: Tam Kim, Kapolei, HI (US); Craig Leidholm, Kailua, HI (US)

(73) Assignee: TruTag Technologies, Inc., Kapolei, HI (US)

( * ) Notice: Subject to any disclaimer, the term of this patent is extended or adjusted under 35 U.S.C. 154(b) by 440 days.

(21) Appl. No.: 14/576,054

(22) Filed: Dec. 18, 2014

(51) Int. Cl.

| | |
|---|---|
| *C25D 11/32* | (2006.01) |
| *C25D 17/08* | (2006.01) |
| *C25D 21/04* | (2006.01) |
| *C25F 3/12* | (2006.01) |
| *C25F 7/00* | (2006.01) |
| *H01L 21/673* | (2006.01) |
| *H01L 21/3063* | (2006.01) |
| *H01L 21/67* | (2006.01) |
| *H01L 21/306* | (2006.01) |
| *C25D 17/06* | (2006.01) |
| *C25D 17/00* | (2006.01) |
| *C25D 11/00* | (2006.01) |

(52) U.S. Cl.
CPC ...... *H01L 21/67086* (2013.01); *C25D 11/005* (2013.01); *C25D 11/32* (2013.01); *C25D 17/008* (2013.01); *C25D 17/06* (2013.01); *C25D 17/08* (2013.01); *C25D 21/04* (2013.01); *C25F 3/12* (2013.01); *C25F 7/00* (2013.01); *H01L 21/30604* (2013.01)

(58) Field of Classification Search
CPC . H01L 21/67086; C25D 11/005; C25D 11/32; C25D 17/008; C25D 21/04; C25D 17/06; C25D 17/08; C25F 7/00; C25F 3/12
See application file for complete search history.

(56) References Cited

U.S. PATENT DOCUMENTS

| | | | |
|---|---|---|---|
| 6,202,655 B1 | 3/2001 | Yamagata | |
| 6,258,244 B1* | 7/2001 | Ohmi | C25D 11/32 205/333 |
| 6,417,069 B1 | 7/2002 | Sakaguchi et al. | |
| 7,727,365 B2 | 6/2010 | Kido | |
| 9,076,642 B2 | 7/2015 | Yonehara et al. | |
| 2004/0180516 A1* | 9/2004 | Watabe | C25D 11/32 438/466 |
| 2005/0183669 A1* | 8/2005 | Parkhe | H01L 21/6831 118/724 |
| 2011/0030610 A1 | 2/2011 | Kamian et al. | |
| 2011/0120882 A1 | 5/2011 | Crafts et al. | |
| 2012/0043216 A1* | 2/2012 | Arvin | C25D 5/04 205/261 |
| 2012/0145553 A1 | 6/2012 | Kramer et al. | |

FOREIGN PATENT DOCUMENTS

WO   WO 2016037110 A1 *  3/2016  ....... H01L 21/67326

* cited by examiner

*Primary Examiner* — Nicholas A Smith
(74) *Attorney, Agent, or Firm* — Van Pelt, Yi & James LLP (57) ABSTRACT

An etcher comprises a bath, a plurality of blades, and a tunnel. The bath includes a first electrode at a first end and a second electrode at a second end. The plurality of blades is configured to fit in the bath. At least one blade of the plurality of blades holds a wafer. At least one tunnel is configured to fit between adjacent blades of the plurality of blades in the bath.

17 Claims, 8 Drawing Sheets

MULTIPLE WAFER SINGLE BATH ETCHER

BACKGROUND OF THE INVENTION

Porous silicon material has many applications including sensors, adsorbents, optical reflectance and refractance applications and battery anodes. It is because of both the material and optical properties of porous silicon, and the relative ease and low cost by which this material can be produced that it has such widespread applications.

Porous silicon production uses etching of silicon wafers in a bath. However, uniformity of etching and speed of etching is limited when a single wafer is etched in a bath. Further, typically, the etch characteristics vary over the surface of the wafer impacting consistency of the materials produced.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A multiple wafer single bath etcher is disclosed. The etcher comprises a bath with a first electrode at a first end and a second electrode at a second end. The etcher comprises a plurality of blades configured to fit in the bath, wherein at least one blade of the plurality of blades holds a wafer. The etcher comprises at least one tunnel, wherein the at least one tunnel is configured to fit between adjacent blades of the plurality of blades in the bath.

In some embodiments, a multiple wafer single bath etcher is disclosed. The etcher enables the production of porous silicon. The etcher increases the ability to produce porous silicon by allowing multiple wafers to be etched simultaneously and to enable uniformity of produced porous silicon across a wafer and between wafers. The etcher includes multiple blades where each blade holds a single wafer. The wafer is held by a blade on the backside outer edge to keep the front side of the wafer open and available for etching. The blades enable isolation of etchant between blades into isolated etch cells—for example, the isolation uses a seal between the blade edge and the bath and seals between the wafer and the blade. The seals between the wafer and blade have a vacuum enabling holding the wafer firmly to the blade during etching. Between the blades in each isolated etch cell, etchant is circulated to keep uniform exposure of etchant on wafer surface (e.g., to remove bubbles, keep etchant refreshed, etc.). In various embodiments, circulation is achieved using rotating paddles or propellers, or a variety of pumps including, but not limited to, diaphragm-type, centrifugal-type, gear-type and peristaltic-type pumps, or any other appropriate manner of circulating. In some embodiments, temperature of the etchant is also actively maintained within each isolated section of the bath.

In some embodiments, aperture(s) or mask(s) is/are placed to reduce either the effective area(s) of the exposed electrode(s) and/or the effective area(s) of the exposed wafer surface(s) to enable uniform wafer etching or to enable patterned etching.

In some embodiments, electrodes at the ends of the bath comprise mesh or matrix using platinum material with specific or minimum wire size and/or wire pitch/spacing to provide a minimum electrode wire density (e.g., a 0.25 to 2 mm diameter wire interlaced at a 1 to 10 mm grid spacing). In various embodiments, electrodes are made using one or more of the following materials: diamond-like carbon, boron-doped diamond, doped silicon, or any other appropriate electrode material.

In some embodiments, the etcher includes a lid for the bath that prevents evaporation which could change bath chemistry. As this process typically requires high-vapor-pressure solvents, the bath chemistry composition can change relatively quickly, thereby affecting the process. To improve the porous silicon etch process, control/minimization of this evaporation is important. A well-designed lid with appropriate seals can significantly reduce this evaporation.

In some embodiments, a tunnel is placed between an electrode and a wafer and/or between wafers. The tunnels improve etch uniformity of the etcher. In some embodiments, the top of the tunnel includes slots to allow the release of bubbles from the etchant solution within the bath.

In some embodiments, a circumferential sparger is placed close to the wafer frontside surface using relatively shallow angle (e.g., angles less than 60 degrees) directed flows to remove bubbles and/or depleted etchant near the frontside surface of the wafer. In various embodiments, the flow rate and/or level of agitation created by the sparger is adjusted by changing the size and number of holes around the sparger ring. In some embodiments, sparger has 1 mm holes. In various embodiments, hole diameters range from less than a millimeter (e.g., 0 mm, 0.5 mm, 0.7 mm, 0.8 mm, 0.9 mm, 1 mm, 1.1 mm, 1.2 mm, 1.3 mm, 1.4 mm, 1.5 mm, etc.) to several millimeters (e.g., 2 mm, 3.mm, 4 mm, etc.) in diameter and/or have different hole sizes on the same sparger to produce a different level and pattern of agitation within the bath, or any other appropriate manner of changing sparger performance. The sparger provides improved chemistry delivery to the etching surface and improved the effective removal of etch-generated bubbles.

In some embodiments, porous silicon films have been shown to exhibit spectral properties dependent on thickness, porosity, and pore diameter. In the case of rugate filters, the etching waveform determines spectral reflectance peaks. In various embodiments, the etching waveform comprises a current waveform, voltage waveform, or any other appropriate waveform. The spectral properties can be observed by analyzing reflected or transmitted light either from, or through, these films. The encoded spectral information can be useful as a means of labeling or authenticating various products or objects when the films, or pieces thereof, are attached to, or embedded within a product, object, or other item. In various embodiments, the films are diced, or otherwise fragmented into small pieces, or tags, ranging from hundreds of nanometers to hundreds of micrometers or more in size. Film thicknesses range from a few micrometers to hundreds of micrometers or more. In some embodiments, the integrity and strength of the spectral structure are enhanced by oxidizing these films, thus forming optically clear silicon dioxide, also known as silica. In various embodiments, the porous silicon film is fragmented then oxidized into silica, oxidized and then fragmented, or any other appropriate sequence of steps to produce a rugate microtag. Porous silica microtags have been shown to exhibit the same spectral properties of their parent film without losing any of the properties or benefits of the parent. These spectral properties include features, such as peaks, that are determined by the various porosities of the film or film layers. It will be obvious to those skilled in the art that tag production can be extended to layered, Bragg-like film and microtag designs.

Figure 1A:
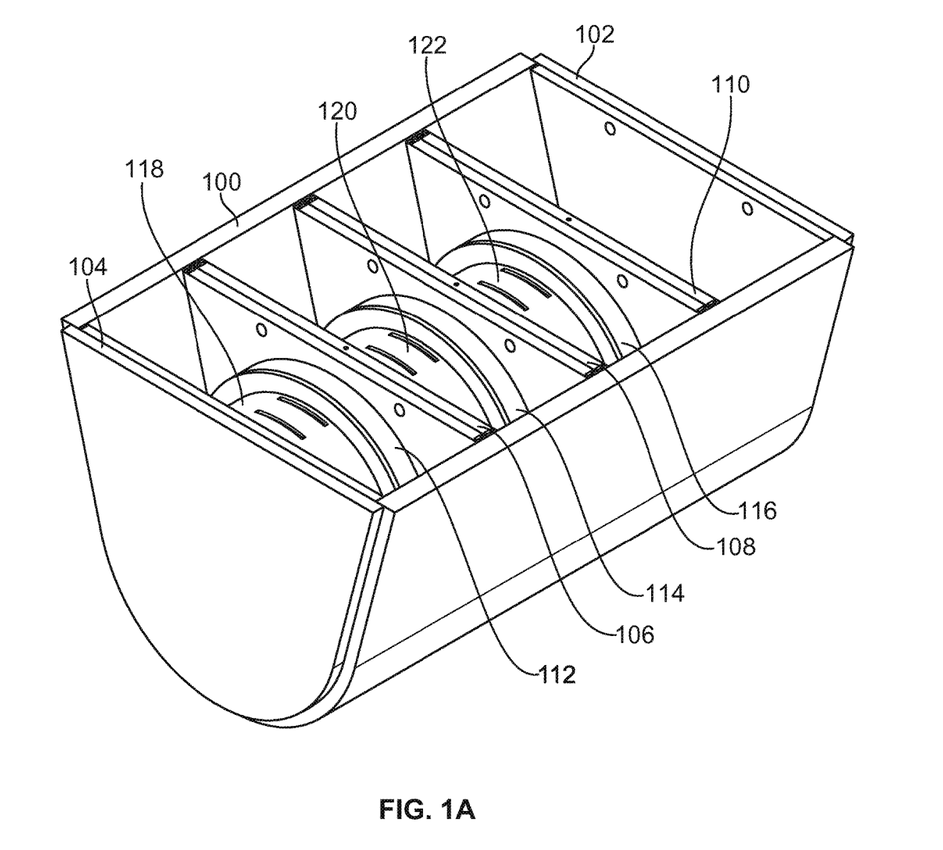
FIG. 1A illustrates an example embodiment of an etcher.

FIG. 1A illustrates an example embodiment of an etcher. In the example shown, bath 100 holds etchant for etching wafers to produce rugate tags. Electrode 102 and electrode 104 create an electric field in bath 100. Bath 100 is able to hold multiple blades (e.g., blade 106, blade 108, and blade 110). Each of the multiple blades holds a wafer that is etched in bath 100. In various embodiments, the number of blades is N, where N is an integer. Each of the multiple blades has a circumferential sparger (e.g., sparger 112, sparger 114, and sparger 116) placed adjacent to it to move bubbles and etchant near the surface. Each of the multiple circumferential sparger has a tunnel (e.g., tunnel 118, tunnel 120, and tunnel 122) placed adjacent to help control electric field of the etcher. Tunnels have slots to enable bubbles to escape. In some embodiments, the bath dimensions are only as large as needed to allow for the wafers to be submerged in the solution such that the etchant surface circulation does not affect etch uniformity. In various embodiments, materials of construction include polypropylene, fluorinated polymers and other polymeric materials that are compatible with the etch chemicals such as hydrofluoric acid and organic solvent such as isopropyl alcohol and ethyl alcohol.

Figure 1B:
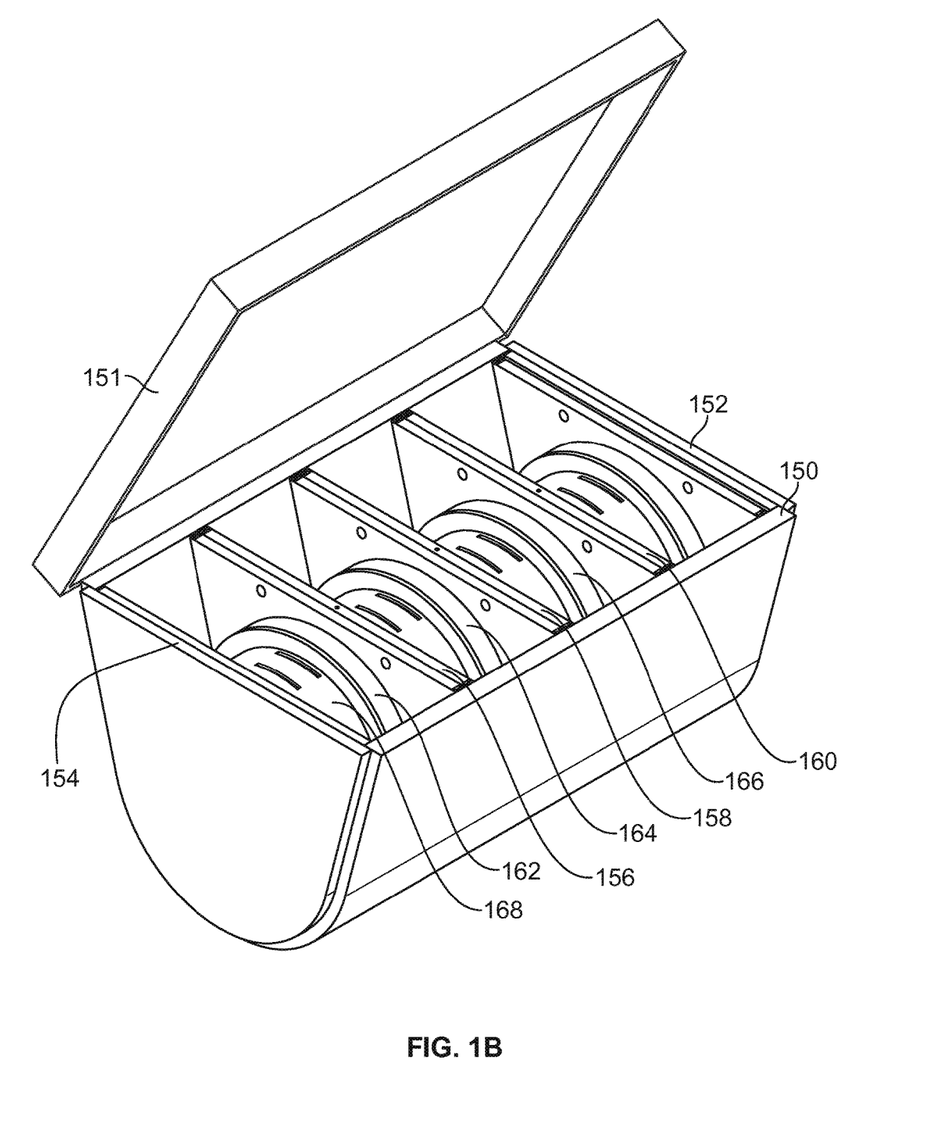
FIG. 1B illustrates an example embodiment of an etcher.

FIG. 1B illustrates an example embodiment of an etcher. In the example shown, bath 150 holds etchant for etching wafers to produce rugate tags. Electrode 152 and electrode 154 create an electric field in bath 150. Bath 150 is able to hold multiple blades (e.g., blade 156, blade 158, and blade 160). Each of the multiple blades holds a wafer that is etched in bath 150. In various embodiments, the number of blades is N, where N is an integer. Each of the multiple blades has a circumferential sparger (e.g., sparger 162, sparger 164, and sparger 166) placed adjacent to it to move bubbles and etchant near the surface. Each of the multiple circumferential sparger has a tunnel (e.g., tunnel 168) placed adjacent to help control electric field of the etcher. Tunnels have slots to enable bubbles to escape. The bath dimensions should be only as large as needed to allow for the wafers to be submerged in the solution such that the etchant surface circulation does not affect etch uniformity. Materials of construction include polypropylene, fluorinated polymers and other polymeric materials that are compatible with the etch chemicals such as hydrofluoric acid and organic solvent such as isopropyl alcohol and ethyl alcohol. Lid 151 reduces or eliminates etchant from evaporating stabilizing the etching.

Figure 2:
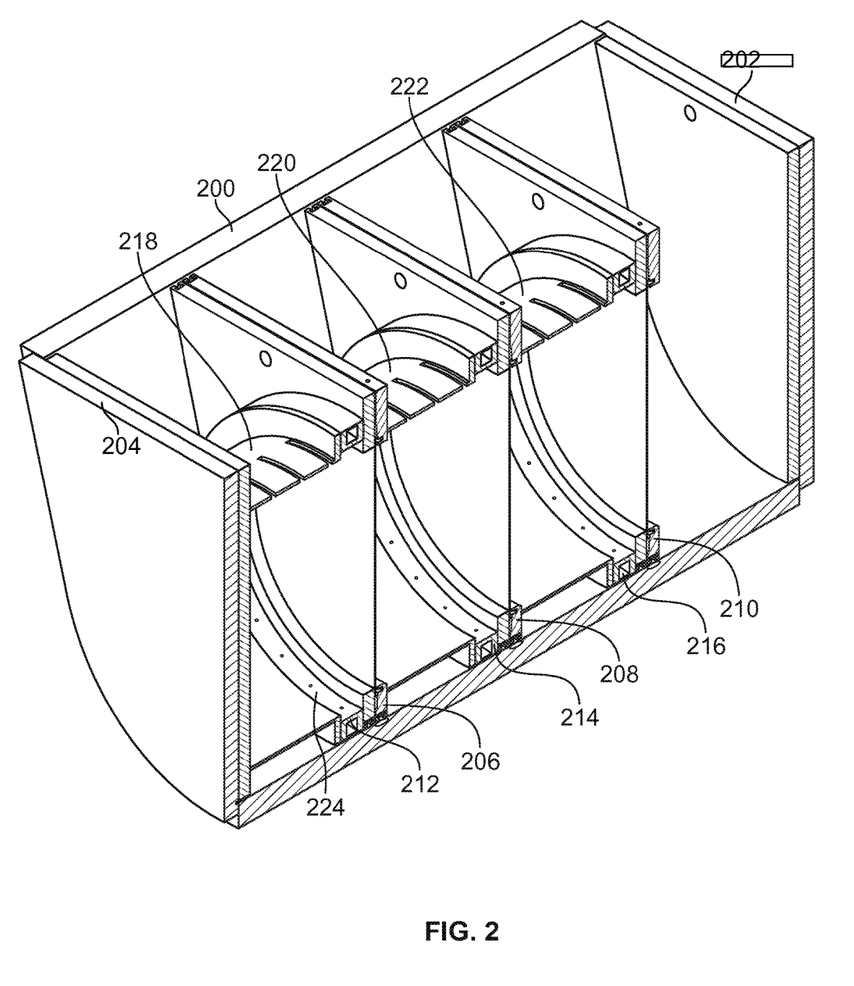
FIG. 2 illustrates an example embodiment of a cutaway view of an etcher.

FIG. 2 illustrates an example embodiment of a cutaway view of an etcher. In some embodiments, bath 200 corresponds to bath 100 of FIG. 1. In the example shown, bath 200 holds etchant for etching wafers to produce rugate tags. Electrode 202 and electrode 204 create an electric field in bath 200. Bath 200 is able to hold multiple blades (e.g., blade 206, blade 208, and blade 210). Each of the multiple blades holds a wafer that is etched in bath 200. In some embodiments, blade dimension is large enough to mount a wafer (e.g., 230 mm wide, 230 mm long, and 10 mm thick, and has round edges at the bottom for edge sealing purpose). In various embodiments, the number of blades is N, where N is an integer. Each of the multiple blades has a circumferential sparger (e.g., sparger 212, sparger 214, and sparger 216) placed adjacent to it to move bubbles and etchant near the surface. Circumferential spargers have holes (e.g., hole 224) spaced around the inner circumference enabling etchant circulated by a pump to the sparger ring to spray toward a wafer surface. For example, 22 holes that are 1 mm in diameter are spaced around the inner circumference of the sparger to provide a combined sparger flow toward the wafer surface of 250 milliliters/minute. In various embodiments, there are less than 15, 15, 16, 17, 18, 19, 20, 21, 22, 23, 24, 25, 26, 27, 28, 29, 30, greater than 30, or any other appropriate number of holes. In various embodiments, the sparger flow through one sparger comprises 100 up to 500, 100, 200, 300, 400, 500 milliliters/minute, or any other appropriate flow rate. In various embodiments, the rate of etch solution circulation is on the order of tens of milliliters per minute to several liters per minute. Each of the multiple circumferential sparger has a tunnel (e.g., tunnel 218, tunnel 220, and tunnel 222) placed adjacent to help control electric field of the etcher. Tunnels have slots to enable bubbles to escape. In various embodiments, slot dimensions are typically on the order of millimeters, enough to allow gas bubbles to escape. The tunnel is typically similar inner diameter (e.g. 200 mm) and the outer diameter is 220 mm.

Figure 3:
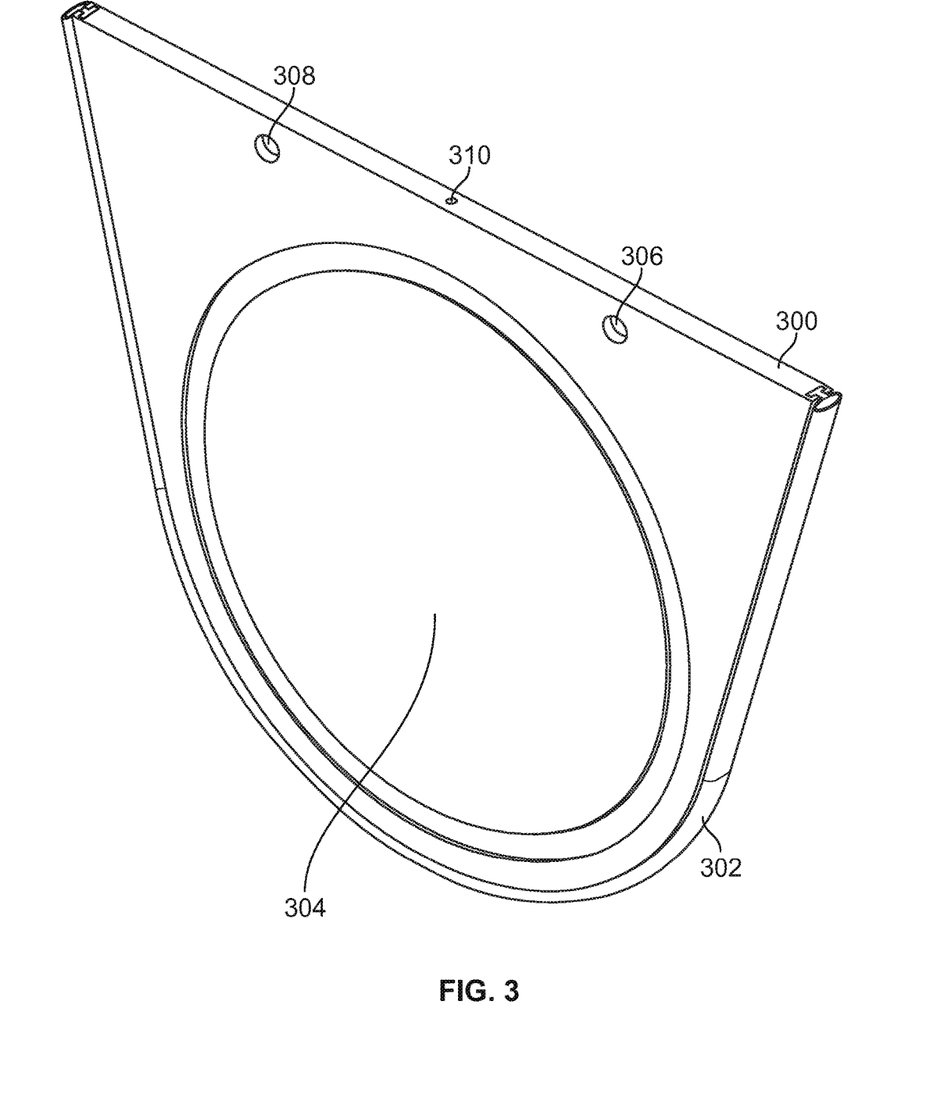
FIG. 3 illustrates an example embodiment of a blade holding a wafer.

FIG. 3 illustrates an example embodiment of a blade holding a wafer. In some embodiments, blade 300 corresponds to blade 110, blade 108, or blade 106 in FIG. 1. In the example shown, blade 300 holds wafer 304. Blade 300 has seal 302 around the edge enabling isolation of the etchant on either side of blade 300. Blade 300 has robot-grasping features (e.g., hole 306 and hole 308) in order that the wafer can be removed and replaced in bath 300. Vacuum access hole 310 enables a vacuum clamp holding wafer 304 to blade 300. In various embodiments, seal materials comprise Viton, polyvinylidene difluoride, or any other appropriate material, which are compatible with the etch chemicals hydrofluoric acid and solvents. In various embodiments, seal shapes are O-rings, gaskets, or any other appropriate shape. In some embodiments, the vacuum seal is located within 5 mm of the wafer's outer edge to minimize the etch exclusion area. The vacuum seal is connected by soft tubing (e.g. ¼" polyethylene tubing) to a vacuum pump via appropriate fittings (e.g. compression tube fittings).

Figure 4:
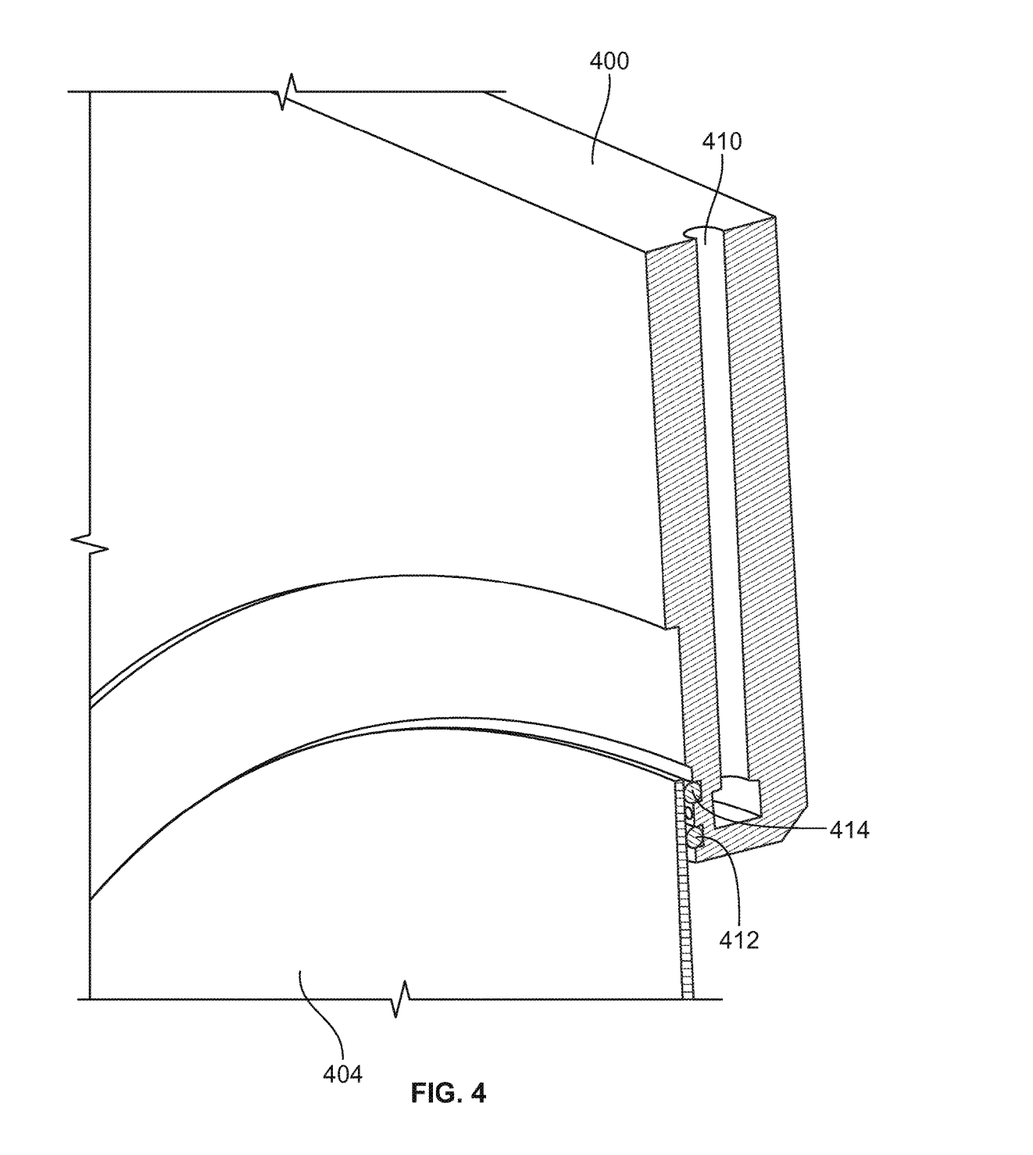
FIG. 4 illustrates an example embodiment of a blade holding a wafer.

FIG. 4 illustrates an example embodiment of a blade holding a wafer. In some embodiments, blade 400 corresponds to blade 110, blade 108, or blade 106 in FIG. 1. In the example shown, blade 400 corresponds to blade 300 of FIG. 3. Vacuum access hole 410 enables a vacuum clamp holding wafer 404 to blade 400. Seal 412 and seal 414 are concentric and are placed close to the edge of wafer 404. Between seal 412 and seal 414 a vacuum is created sealing wafer 402 to blade 400. Vacuum is provided to the space between seal 412 and seal 414 via vacuum access hole 410.

Figure 5:
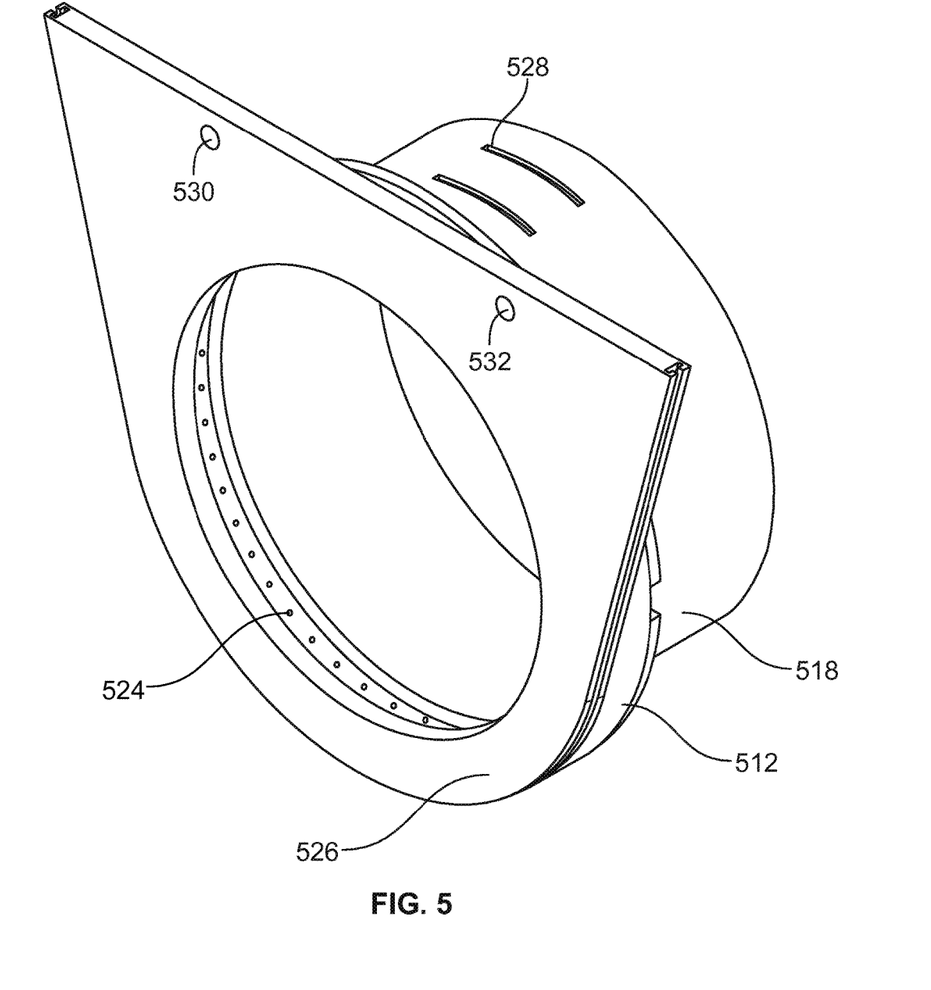
FIG. 5 illustrates an example embodiment of a blade coupled to a sparger that is coupled to a tunnel.

FIG. 5 illustrates an example embodiment of a blade coupled to a sparger that is coupled to a tunnel. In some embodiments, tunnel 518 corresponds to tunnel 118, tunnel 120, or tunnel 122 of FIG. 1. In the example shown, blade 526 is coupled to circumferential sparger 512. Circumferential sparger 512 has similar inner diameter hole as hole in blade 526 and tunnel 518. Tunnel 518 has similar inner diameter hole as wafer diameter. Blade 526 enables circumferential sparger 512 to be placed close to a wafer surface so that holes 524 direct a liquid flow toward the surface of the wafer. The liquid flow circulates the fluid close to the wafer surface to enable uniform etching or desired non-uniform etching (e.g., if a pattern is desired for the etching of the wafer). Tunnel 518 is coupled to circumferential sparger 512. Hole 530 and hole 532 enable a robot to grasp blade 526 and remove and replace blade 526 in a bath. Slot 528 allows bubbles to escape from tunnel 518. In some embodiments, each slot is 2-5 mm wide and several centimeters long and located at the top apex of the tunnel. In some embodiments, there are multiple slots on each tunnel (e.g., 3-5 slots on each tunnel). There is no seal at the edge of blade 526. There is no seal between tunnel 518 and a wafer holding blade or between blade 526 and wafer holding blade. In some embodiments, wetted materials of construction comprise polypropylene and fluorinated polymers that are chemically compatible with hydrofluoric acid and solvents. In various embodiments, sparger hole diameters ranges from less than a millimeter to several millimeters in diameter and can have different hole sizes on the same sparger to produce a different level and pattern of agitation within the bath, or any other appropriate configuration for the sparger. In some embodiments, the sparger holes are evenly spaced. In various embodiments, the sparger, tunnel, and blade are mechanically mounted in the bath using one or more of the following: polypropylene or other chemically compatible screws, welding, press fitting together and machined mating parts, or any other appropriate mounting.

Figure 6:
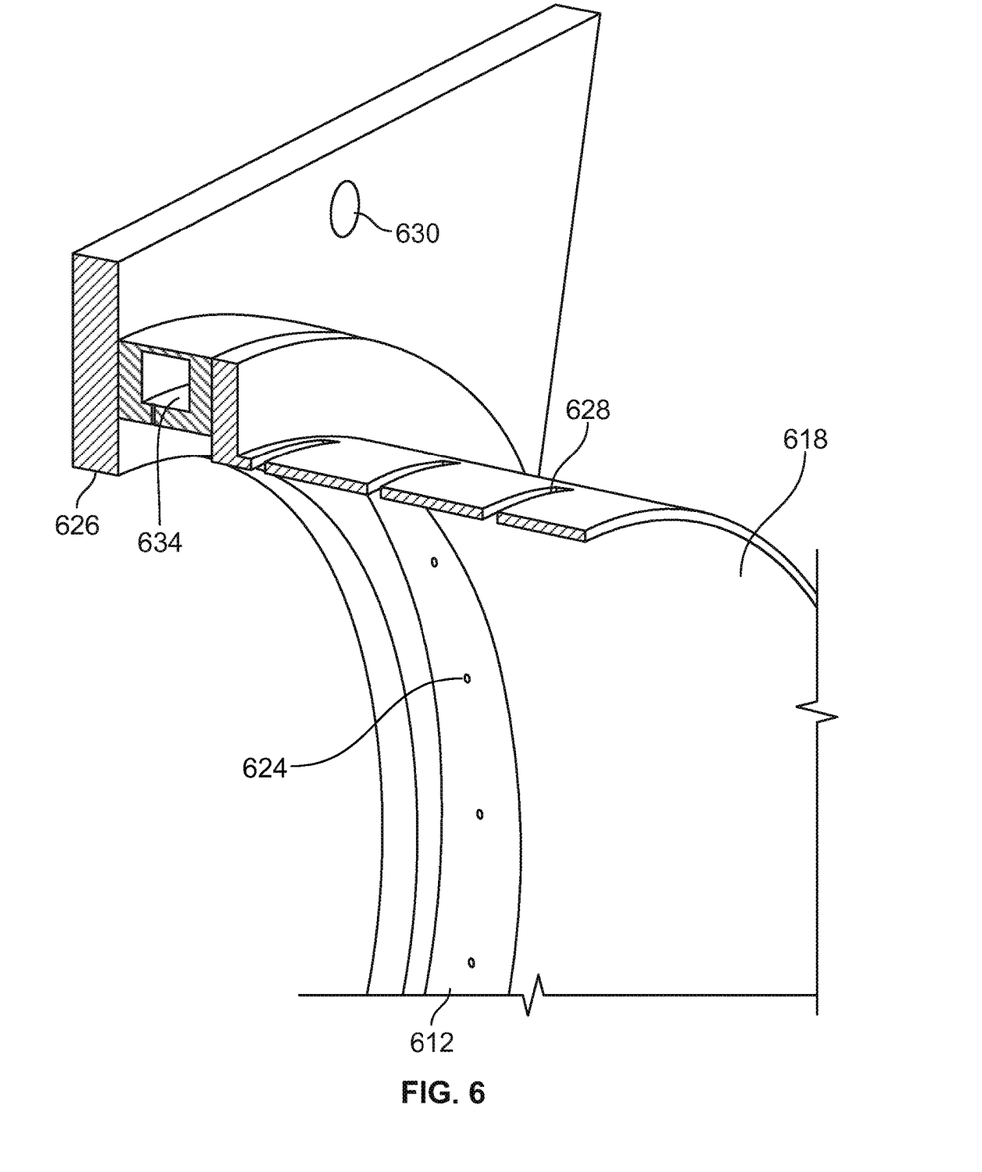
FIG. 6 illustrates an example embodiment of a blade coupled to a sparger that is coupled to a tunnel in a cutaway view.

FIG. 6 illustrates an example embodiment of a blade coupled to a sparger that is coupled to a tunnel in a cutaway view. In some embodiments, tunnel 618 corresponds to tunnel 118, tunnel 120, or tunnel 122 of FIG. 1. In the example shown, blade 626 is coupled to circumferential sparger 612. Circumferential sparger 612 has similar inner diameter as the wafer diameter. Tunnel 618 has similar inner diameter as wafer diameter, (e.g., 200 millimeters) in this example. Blade 626 enables circumferential sparger 612 to be placed close to a wafer surface so that holes 624 direct a liquid flow toward the surface of the wafer. The liquid flow circulates the fluid close to the wafer surface to enable uniform etching or desired non-uniform etching (e.g., if a pattern is desired for the etching of the wafer). Liquid access cutout 634 provides liquid to holes of circumferential sparger 612 (e.g., hole 624). Tunnel 618 is coupled to circumferential sparger 612. Hole 630 enable a robot to grasp blade 626 and remove and replace blade 626 in a bath. Slot 628 allows bubbles to escape from tunnel 618. In some embodiments, slot 628 is typically 2-5 mm wide and several centimeters long and located at the top apex of the tunnel. In some embodiments, there are multiple slots (e.g., 3-5 slots) on each tunnel. There is no seal at the edge of blade 626. There is no seal between tunnel 618 and a wafer holding blade or between blade 626 and wafer hold blade. In some embodiments, the wetted part materials of construction comprise polypropylene and fluorinated polymers that are chemically compatible with hydrofluoric acid and solvents. In various embodiments, sparger hole diameters range from less than a millimeter to several millimeters in diameter, or any other appropriate dimensions. In various embodiments, there are different hole sizes on the same sparger to produce a different level and pattern of agitation within the bath, or any other appropriate configuration. In some embodiments, sparger holes are evenly spaced. In some embodiments, sparger, tunnel, and blade are mechanically mounted in the bath using polypropylene or other chemically compatible screws, welded, pressed fit together using machined mating parts, or using any other appropriate mounting.

Figure 7:
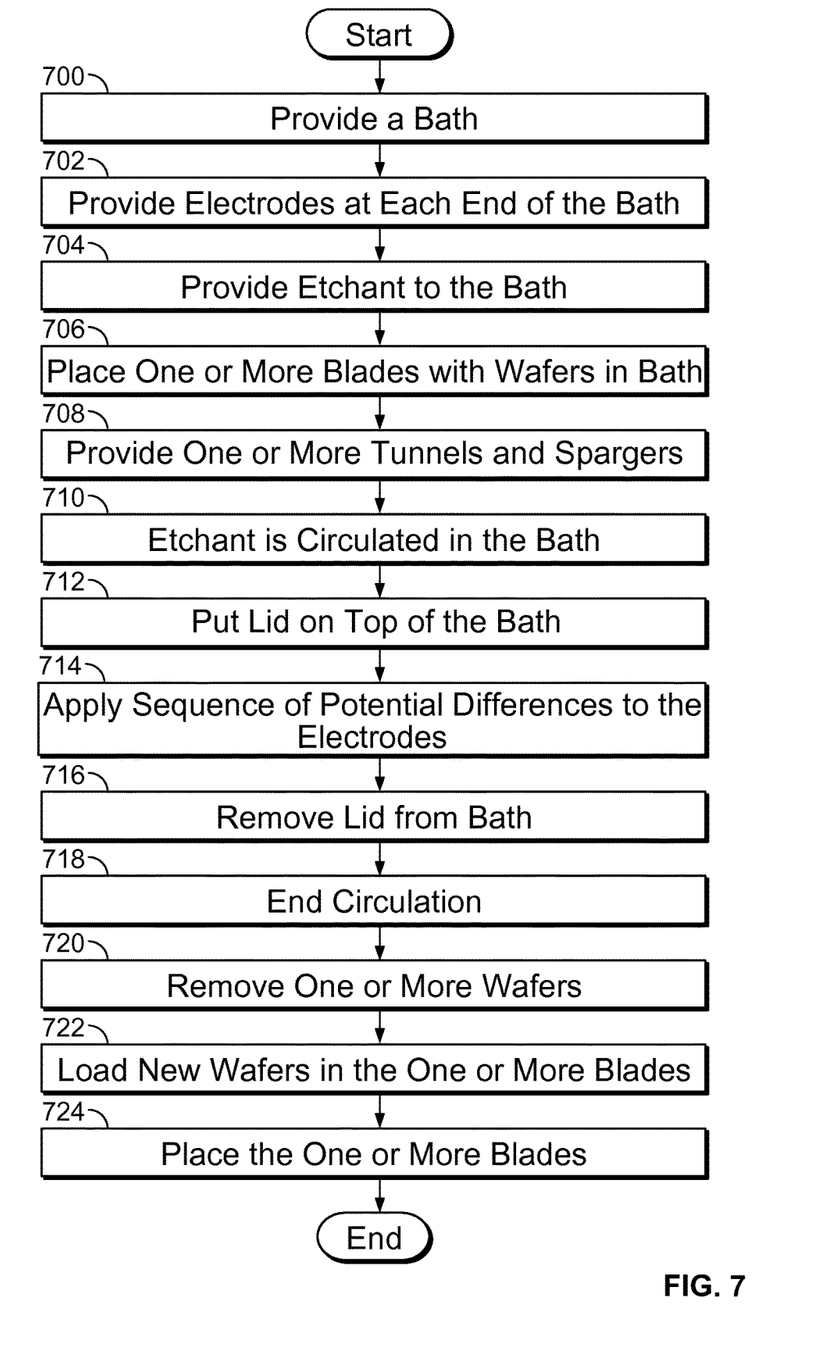
FIG. 7 is a flow diagram illustrating an embodiment of a process for etching.

FIG. 7 is a flow diagram illustrating an embodiment of a process for etching. In some embodiments, the process of FIG. 7 is used to etch wafers in a bath (e.g., bath 100 in FIG. 1). In the example shown, in 700 a bath is provided. In 702, electrodes are provided at each end of the bath. In 704, etchant is provided in the bath. The etchant is typically a mixture of hydrofluoric acid, water, and ethanol. In some embodiments, other solvents, such as isopropyl alcohol are used. In some embodiments, the volume of solvent depends on the etcher size (e.g., between 4 liters to 40 liters). For example, an etchant is pumped into the bath. In 706, one or more blades with wafers are placed in the bath. For example, a vacuum is applied to a blade clamp to hold a wafer to the blade. In 708, one or more tunnels and spargers are provided in the bath. For example, a tunnel is coupled to a blade and a sparger is coupled to the blade and the tunnel, the sparger, and the blade are placed in the bath. In 710, etchant is circulated in the bath using the spargers within each cell between the one or more blades with the wafers. In 712, a lid is put on the top of the bath. In 714, a sequence of potential differences is applied to the electrodes. For example, to etch the wafers a sequence of potential differences is applied to the electrodes. In various embodiments, the electric potential is a sinusoidal wave pattern or a sum of multiple sinusoidal waveforms that vary the electric potential from high to low in a complex manner, or any other appropriate pattern. In 716, the lid is removed. In 718, the circulation is ended. In 720, the one or more wafers are removed by removing blades and removing the tabs. In 722, new wafers are loaded in the one or more blades. In 724, the one or more blades are replaced in the bath. And the process ends. In some embodiments, the process repeats with the new wafers.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An etcher, comprising:
   a bath with a first electrode at a first end and a second electrode at a second end;
   a plurality of blades configured to fit in the bath, wherein at least one blade of the plurality of blades holds a wafer;
   a sparger, wherein the sparger includes holes to enable liquid to move near an etch side of the wafer, wherein the holes are situated circumferentially at a shallow angle to the etch side of the wafer; and
   at least one tunnel, wherein the at least one tunnel is configured to fit between adjacent blades of the plurality of blades in the bath.

2. An etcher of claim 1, further comprising a lid that covers the bath.

3. An etcher of claim 1, wherein the at least one blade holds the wafer using a vacuum clamp at a backside outer edge of the wafer.

4. An etcher of claim 3, wherein the vacuum clamp comprises a vacuum space between two concentric seals and the backside outer edge of the wafer.

5. An etcher of claim 1, wherein the first at least one blade has a seal at an outer edge.

6. An etcher of claim 1, wherein the first at least one blade has one or more robot grasping features.

7. An etcher of claim 6, wherein a grasping feature of the one or more robot grasping feature comprises one or more of the following: a hole, a ledge, a peg, a lip, or a slot.

8. An etcher of claim 1, wherein the tunnel includes one or more top slots.

9. An etcher of claim 1, wherein the tunnel is attached to a holder.

10. An etcher of claim 1, wherein the sparger is attached to the tunnel.

11. An etcher of claim 1, further comprising a temperature controller.

12. An etcher of claim 1, wherein the first electrode comprises a wire mesh.

13. An etcher of claim 12, wherein the wire mesh comprises a platinum mesh with a 1 to 10 mm grid spacing.

14. An etcher of claim 13, wherein the minimum wire density is achieved using a wire size of 0.25 to 2 mm diameter with a 1 to 10 mm grid spacing.

15. A method for etching, comprising:
   providing a bath with a first electrode at a first end and a second electrode at a second end;
   providing a plurality of blades configured to fit the bath, wherein a first blade of the plurality of blades holds a wafer;
   providing a sparger, wherein the sparger includes holes to enable liquid to move near an etch side of the wafer, wherein the holes are situated circumferentially at a shallow angle to the etch side of the wafer;
   providing a tunnel, wherein the tunnel is configured to fit between the first blade of the plurality of blades and a second blade of the plurality of blades in the bath; and
   etching the wafer.

16. A method of claim 15, wherein the at least one blade holds the wafer using a vacuum clamp at a backside outer edge of the wafer.

17. A method of claim 16, wherein the vacuum clamp comprises a vacuum space between two concentric seals and the backside outer edge of the wafer.

* * * * *